(12) United States Patent
Sakawaki et al.

(10) Patent No.: US 6,680,133 B2
(45) Date of Patent: Jan. 20, 2004

(54) MAGNETIC RECORDING MEDIUM AND SPUTTERING TARGET

(75) Inventors: Akira Sakawaki, Chiba (JP); Masakazu Kobayashi, Chiba (JP); Hiroshi Sakai, Chiba (JP)

(73) Assignee: Showa Denko Kabushiki Kaisha, Tokyo (JP)

( * ) Notice: Subject to any disclaimer, the term of this patent is extended or adjusted under 35 U.S.C. 154(b) by 213 days.

(21) Appl. No.: 09/731,704

(22) Filed: Dec. 8, 2000

(65) Prior Publication Data

US 2002/0009619 A1 Jan. 24, 2002

Related U.S. Application Data

(60) Provisional application No. 60/169,627, filed on Dec. 8, 1999.

(51) Int. Cl.[7] .............................. G11B 5/66; G11B 5/70
(52) U.S. Cl. ......................... 428/694 TS; 428/694 TP; 428/900
(58) Field of Search ....................... 428/694 T, 694 TS, 428/900, 694 TP

(56) References Cited

U.S. PATENT DOCUMENTS 5,314,745 A    5/1994   Okumura et al. ........ 428/694 T
5,480,733 A    1/1996   Okumura et al. ........... 428/336

FOREIGN PATENT DOCUMENTS

| JP | 62-183026  | * | 8/1987 |
| JP | 05-197941 A |   | 8/1993 |
| JP | 06-267050 A |   | 9/1994 |

OTHER PUBLICATIONS

Patent Abstracts of Japan, abstracting JP 06–267050 of Sep. 22, 1994.

Patent Abstracts of Japan, abstracting JP 05–197941 of Aug. 6, 1993.

* cited by examiner

*Primary Examiner*—Holly Rickman
(74) *Attorney, Agent, or Firm*—Sughrue Mion, PLLC

(57) ABSTRACT

A magnetic recording medium comprising a non-metallic substrate, a non-magnetic undercoat film, a magnetic film, and a protective film are formed, wherein an orientation-determining film, which determines crystalline orientation of a film provided directly on the orientation-determining film when subjected to surface-texturing, is formed between the non-metallic substrate and the non-magnetic undercoat film. The orientation-determining film comprises NiPX and X has a melting point of 600-2000° C.

7 Claims, 1 Drawing Sheet

MAGNETIC RECORDING MEDIUM AND SPUTTERING TARGET

CROSS REFERENCE TO RELATED APPLICATIONS

This application is an application filed under 35 U.S.C. §111(a) claiming benefit pursuant to 35 U.S.C. §119(e)(1) of the filing date of Provisional Application 60/169,627 filed Dec. 8, 1999 pursuant to 35 U.S.C. §111(b).

FIELD OF THE INVENTION

The present invention relates to a magnetic recording medium used in an apparatus such as a magnetic disk apparatus.

BACKGROUND OF THE INVENTION

In recent years, enhancement in the recording density of a magnetic disk apparatus has resulted in demand for a reduction in the distance between a magnetic head and a magnetic recording medium during data readout.

The distance between the aforementioned head and medium is preferably reduced, for example, to 10 nm or less, so as to attain a magnetic recording medium having a recording density of 10 Gbits/inch$^2$ or more. In order to avoid collision with the head, the magnetic recording medium preferably has a smooth surface.

In addition, a substrate of a magnetic recording medium must have sufficient hardness in order to prevent formation of dimples on a surface thereof caused by collision with a magnetic head in the event of impact-induced damage in a magnetic disk apparatus.

Generally, a substrate which is formed of an aluminum alloy and coated with NiP alloy plating film (hereinafter referred to as an "NiP-plated Al substrate") is widely used for producing a magnetic recording medium. The NiP alloy plating film is provided to harden the surface of the substrate to enhance durability, and to facilitate polishing and evening of the surface.

Typically, on the surface of NiP alloy plating film, grooves which are collectively called texture are mechanically formed along the circumferential direction by use of a lapping tape or free abrasive grains to reduce contact resistance between the surface of a medium and a magnetic head and to enhance durability.

The texture uniformly aligns crystal axes of Co alloy to the circumferential direction of a substrate, forming a magnetic film, and preventing excessive growth of magnetic particles to make grain size distribution sharp.

Although an NiP-plated Al substrate is surface-polished to enhance surface smoothness for making the distance between a magnetic head and medium fall within the aforementioned range, surface polishing is unsatisfactory in view of reliability and cost.

Furthermore, since an NiP-plated Al substrate comprises NiP alloy plating film having satisfactory hardness and an Al substrate having poor hardness, a magnetic recording medium employing the NiP-plated Al substrate has a drawback. For example, when a magnetic disk apparatus is damaged by impact, a magnetic head of the apparatus collides with the recording medium thereby deforming a collision portion of the Al substrate and forming a dimple, called "head slap," in the surface of the magnetic recording medium. The dimple may cause errors during reproduction of recorded data.

Thus, in many cases a hard non-metallic substrate formed of material such as glass or ceramic has recently replaced an Al substrate. Particularly, when a glass substrate is employed, sufficient surface smoothness for adjusting the distance between a magnetic head and medium to the aforementioned value can be attained easily at low cost. In addition, such substrates per se have high hardness, thereby advantageously preventing head slap.

In contrast, when a substrate formed of glass or ceramic is employed in a magnetic recording medium, texturing of the substrate is disadvantageously difficult, because the substrate has high hardness.

Texturing includes providing uniform crystalline orientation in an undercoat film so as to orient the crystalline orientation of a magnetic film to a predetermined direction, and is an important step for obtaining excellent magnetic properties during formation of films such as an undercoat film, a magnetic film, and a protective film on a substrate.

Therefore, when the aforementioned non-metallic substrate formed of glass or ceramic, which substrate is difficult to subject to texturing, is employed, the produced magnetic recording medium has unsatisfactory magnetic characteristics.

In order to overcome such drawbacks, there has been proposed formation of a hard film which can be easily textured on a non-metallic substrate formed of material such as glass or ceramic (e.g., Japanese Patent Application Laid-Open (kokai) Nos. 4-295614 and 9-167337). Specifically, a magnetic recording medium employing a non-metallic substrate which is plated with film such as electroless plating film is disclosed therein.

However, the disclosed magnetic recording medium is produced through cumbersome steps, and an electroless plating substrate must contain a heavy metal such as palladium or platinum as a plating catalyst. Thus, there still exist problems, such as post-treatment of wastewater and handling of catalyst material.

In order to solve these problems, there has been proposed a magnetic recording medium having a non-metallic substrate formed of material such as glass or ceramic, and the substrate is coated through sputtering with NiP film serving as a hard film which can be textured (e.g., Japanese Patent Application Laid-Open (kokai) No. 5-197941).

There has also been proposed formation of film comprising NiP alloy and a third element on a non-metallic substrate in order to prevent magnetization of the NiP film caused by heating during production of a magnetic recording medium (e.g., Japanese Patent Application Laid-Open (kokaz) No. 6-267050).

Even though these disclosed magnetic recording media employ a hard non-metallic substrate formed of material such as glass or ceramic, texturing can be carried out.

However, the aforementioned magnetic recording media still have problems; i.e., still exhibit insufficient processability during texturing of a substrate.

Specifically, a NiP film which is formed on a surface of a substrate through sputtering has hardness lower than that of a film formed by electroless plating and is embrittled, thereby resulting in easy formation of fins and deep grooves in the surface of the NiP film during texturing. As a result, surface smoothness sufficient for reducing the distance between a head and a medium cannot be obtained, and errors may occur during reproduction of recorded data.

In production of a magnetic recording medium disclosed in Japanese Patent Application Laid-Open (kokai) No.

6-267050, a third element (Z) is added to NiP to form NiPZ film which is magnetized at higher temperature. However, the NiPZ film has high hardness and exhibits poor processability (e.g., grinding amount, and density of texture lines) during texturing. Thus, magnetic characteristics of the recording medium are disadvantageously and easily deteriorated.

In addition, the aforementioned conventional magnetic recording media have unsatisfactory S/N ratio, error rate, and resistance to thermal fluctuation.

In view of the foregoing, an object of the present invention is provide a magnetic recording medium having excellent surface smoothness and magnetic characteristics such as S/N ratio, error rate, and resistance to thermal fluctuation.

SUMMARY OF THE INVENTION

The present invention provides a magnetic recording medium comprising (a) a non-metallic substrate, (b) a non-magnetic undercoat film, (c) a magnetic film, (d) a protective film, and (e) an orientation-determining film, which determines crystalline orientation of a film provided directly on the orientation-determining film when subjected to surface-texturing, between the non-metallic substrate and the non-magnetic undercoat film. The orientation-determining film comprises NiPX; and X is one or more species selected from the group consisting of Group IIA, IIIA, VIIA, VIII, IB, IIIB, IVB, and VB, other than Ac (actinide)-series elements and X has a melting point of 600–2000° C.

Preferably, the orientation-determining film comprises a material containing P and X in a total amount of 20–50 atomic %. Preferably, the P content is 15–40 atomic % and the X content is 2–25 atomic %.

Preferably, a non-magnetic adhesive film which prevents defoliation of the orientation-determining film from the substrate is formed between the non-metallic substrate and the orientation-determining film, and the non-magnetic adhesive film comprises one or more species selected from among Cr, Mo, Nb, V, Re, Zr, W, and Ti.

The present invention provides a sputtering target for forming an orientation-determining film contained in the aforementioned magnetic recording medium. The target comprises sintered NiPX, wherein X has a melting point of 600–2000° C.; X is one or more species selected from among elements of Group IIA, IIIA, VIIA, VIII, IB, IIIB, IVB, and VB (with Ac (actinide)-series elements being excluded); the total amount of P and X is 20–50 atomic %; and the balance consists substantially of Ni.

Preferably, the P content is 15–40 atomic % and the X content is 2–25 atomic %.

DESCRIPTION OF THE PREFERRED EMBODIMENTS

Figure 1:
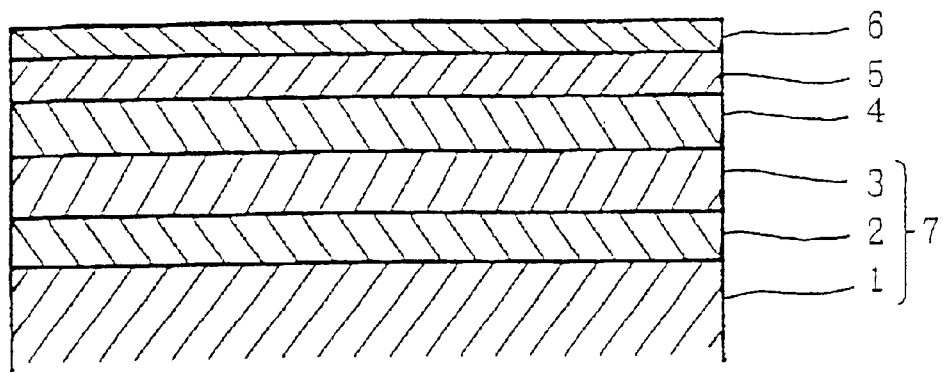
FIG. 1 is a partial cross-sectional view showing an embodiment of the magnetic recording medium of the present invention.

FIG. 1 is a schematic representation showing an embodiment example of the magnetic recording medium of the present invention. The magnetic recording medium comprises a non-metallic substrate 1, a non-magnetic adhesive film 2, an orientation-determining film 3, a non-magnetic undercoat film 4, a magnetic film 5, and a protective film 6, in which the film 3 is formed on the substrate 1 by the intervention of the film 2, and the films 4 to 6 are successively formed on the film 3. Hereinafter, the structure from the substrate 1 to the film 3 will be called a medium substrate 7.

A material comprising non-metallic material such as glass, ceramic, a mixture thereof, silicon, or silicon carbide is employed as the non-metallic substrate 1. Particularly, glass, ceramic, or a mixture thereof is preferably employed in consideration of durability and cost.

A glass substrate may be widely-used soda-lime glass, aluminocate glass, aluminosilicate glass, or lithium-based crystallized glass. A ceramic substrate may be a widely-used sintered compact predominantly containing aluminum oxide, aluminum nitride, and silicon nitride; or fiber-reinforced material thereof.

The surface of the non-metallic substrate 1 is preferably polished in advance, and the substrate has a surface roughness Ra of 100 Å or less, preferably 20 Å or less.

The adhesive film 2 is provided in order to prevent the orientation-determining film 3 from peeling off the substrate 1, and the film 2 may be formed of a material which has excellent adhesion to the substrate 1 and the film 3. For example, the film 2 may be formed of an alloy predominantly containing one or more species selected from among Cr, Mo, Nb, V, Re, Zr, W, and Ti.

The thickness of the adhesive film 2 is 200 nm or less, preferably 20–200 nm. When the thickness is in excess of 200 nm, the surface irregularity of the film 2 increases, and thus the surface irregularity of the magnetic recording medium increases, which is unsatisfactory.

The orientation-determining film 3 is provided for enhancing the crystalline orientation of the non-magnetic undercoat film 4 which is formed on the film 3 to enhance the crystalline orientation of the magnetic film 5 which is formed on the film 4. The film 3 is comprised of NiPX and is a film which is subjected to texturing on the surface.

The orientation-determining film 3 determines the crystalline orientation of the non-magnetic undercoat film 4, and also functions as a film for forming fine crystal grains; i.e., the film 3 forms fine crystal grains in the film 4 to thereby form fine magnetic grains in the magnetic film 5.

X is a material having a melting point of 600–2000° C., preferably 600–1600° C., more preferably 900–1600° C.

When the melting point of X is below the above range, the magnetization temperature of the orientation-determining film 3 decreases and the film 3 tends to be magnetized, and thus magnetic characteristics of the magnetic recording medium deteriorate. In addition, the film 3 has low hardness and embrittles, which results in poor texture processability.

In contrast, when the melting point is in excess of the above range, the orientation-determining film 3 has very high hardness, which results in poor texture processability of the surface of the film. As a result, it is difficult to obtain sufficient density, depth, width and uniformity of texture lines, which are required for imparting satisfactory orientation to the non-magnetic undercoat film 4 and the magnetic film 5 in the course of texturing.

X is preferably one or more species selected from among elements of Group IIA, IIIA, VIIA, VIII, IB, IIIB, IVB, and VB (with Ac (actinide)-series elements being excluded).

Specific examples of X will be described together with a melting point thereof. A numeral in parenthesis following a chemical symbol represents melting point (° C.).

Examples of X include Group IIA elements such as Be (1278), Mg (651), Ca (848), Sr (769), Ba (725), and Ra (700); Group IIIA elements such as Sc (1400), Y (1495), La (880), Ce (795), Pr (approximately 940), Nd (1024), Sm (1072), Tb (approximately 1450), and Ho (approximately 1500); Group VIIA elements such as Mn (1244); Group VIII elements such as Fe (1535), Pd (1554), Co (1494), and Rh (1966); Group IB elements such as Cu (1085), Ag (962), and Au (1064); Group IIIB elements such as Al (660); Group IVB elements such as Si (1414) and Ge (959); and Group VB elements such as As (817) and Sb (631).

In addition, X may be elements of Group IVA, VA, and VIA; for example, Ti (1675), Zr (1852), V (1890), and Cr (1890).

Of these elements, X is preferably selected from among Be (1278), Mg (651), Ca (848), Sr (769), Ba (725), Ra (700), Sc (1400), Y (1495), La (880), Ce (795), Sm (1072), Mn (1244), Fe (1535), Pd (1554), Co (1494), Cu (1085), Ag (962), Au (1064), Al (660), Si (1414), Ge (959), As (817), and Sb (631), all of which have a melting point falling within a range of 600–1600° C.

In the orientation-determining film 3, when the amounts of P and X are represented by "a" and "b," respectively, the sum of the amounts of P and X; i.e., "a+b" is preferably 20–50 atomic %.

In the film 3, a is 15–40 atomic %, preferably 20–30 atomic %, and b is preferably 2–25 atomic %.

When the amount of P is less than 15 atomic %, the orientation-determining film 3 tends to be magnetized, which results in poor magnetic characteristics of the magnetic recording medium, whereas when the amount of P is in excess of 40 atomic %, the film 3 has very high hardness, which results in poor texture processability of the surface of the film 3.

When the amount of X is less than 2 atomic % or the sum of the amounts of P and X is less than 20 atomic %, the orientation-determining film 3 embrittles, which results in poor texture processability of the surface of the film 3.

In contrast, when the amount of X is in excess of 25 atomic % or the sum of the amounts of P and X is in excess of 50 atomic %, the orientation-determining film 3 rarely exhibits its original characteristics, which results in poor texture processability. In addition, the film 3 has poor ability to determine the crystalline orientation of the non-magnetic undercoat film 4. As a result, the crystalline orientation of the film 4 and the magnetic film 5 deteriorate, which results in unsatisfactory magnetic anisotropy of the film 5.

The amount of X is in excess of 10 atomic % and 25 atomic % or less, preferably 15–25 atomic %, for the reasons described below. When the amount of X falls within the above range, the orientation-determining film 3 has satisfactory hardness and viscosity, and thus texture processability is enhanced.

The thickness of the orientation-determining film 3 is 20 nm or more, preferably 20–300 mn. When the thickness is below the above range, the adhesive film 2 may be exposed at texturing, whereas when the thickness is in excess of the above range, the film 3 tends to be peeled off and to have unevenness on the surface, which is unsatisfactory.

In a magnetic recording medium for producing an MR head, the flying height of a magnetic head must be reduced in order to increase recording density, and thus the surface roughness (Ra) of the orientation-determining film 3 is preferably 2 nm or less.

The non-magnetic undercoat film 4 may be formed of conventionally-known materials for undercoat film. For example, the film may be formed of an alloy of one or more species selected from among Cr, Ti, Ni, Si, Ta, W, Mo, V, and Nb. Alternatively, the film may be comprised of an alloy of one or more of the above elements and other elements so long as such "other elements" do not impede the crystallinity of the film.

The material of the non-magnetic undercoat film 4 is preferably an alloy of Cr, Cr/Ti, Cr/W, Cr/V, or Cr/Si.

The non-magnetic undercoat film 4 may be of a single-layer structure, or of a multi-layer structure formed of a plurality of films which have the same composition or different compositions. The thickness of the film 4 is 1–200 nm, preferably 2–100 nm.

The magnetic film 5 is comprised of a material predominantly containing Co, and the material is, for example, an alloy of Co and one or more species selected from among Cr, Pt, Ta, B, Ti, Ag, Cu, Al, Au, W, Nb, Zr, V, Ni, Fe, and Mo.

Preferable specific examples of the above material include materials predominantly containing alloys of Co/Cr/Ta, Co/Cr/Pt, and Co/Cr/Pt/Ta. Of these alloys, in particular, a Co/Cr/Pt/Ta alloy is preferably employed.

The thickness of the magnetic film may be 10–40 nm.

The protective film 6 may be formed of conventionally-known materials. For example, the film may be formed of a material containing a single component such as carbon, silicon oxide, silicon nitride, or zirconium oxide, or a material predominantly containing such components.

The thickness of the protective film 6 is preferably 2–20 nm.

If necessary, a lubrication film which comprises a fluorine-based liquid lubricant such as perfluoropolyether or a lubricant such as a fatty acid may be provided on the protective film 6.

The adhesive film 2, the orientation-determining film 3, the non-magnetic undercoat film 4, the magnetic film 5, and the protective film 6 in the above-described magnetic recording medium may be formed by means of sputtering.

When the orientation-determining film 3 is formed by means of sputtering, a target containing P, X, and Ni may be employed. In the target, when the amounts of P and X are represented by "a" and "b," respectively, the sum of the amounts of P and X; i.e., "a+b," is 20–50 atomic %, and the balance consists substantially of Ni. In the target, a and b are preferably 15–40 atomic % and 2–25 atomic %, respectively.

The target may be a sintered alloy target or an alloy target produced through a cast method. Particularly, a sintered alloy target is preferably employed.

Such a sintered alloy target may be produced by means of a conventionally-known sintering method such as hot isostatic pressing (HIP) or hot pressing, from alloy powder of the above-described composition, a plurality of alloy powders which are mixed so as to obtain the above-described composition, or a mixture of mono-metallic powders.

Incidentally, the above-described alloy metallic powder may be produced by means of a conventionally-known method such as a gas-atomizing method.

The surface of the orientation-determining film 3 is subjected to texturing through mechanical texturing performed by use of a lapping tape or free abrasive grains.

The surface of the film may be subjected to chemical etching or electrolytic etching (electrolytic polishing) in order to remove fine fins and burrs which are produced on the surface during mechanical texturing, and to obtain excellent surface evenness.

In the magnetic recording medium of the embodiment, the orientation-determining film 3 is comprised of NIPX, and X has a melting point of 600–2000° C., and thus the texture processability of the film 3 can be enhanced.

Thus, grinding which is required to sufficiently even the surface of the orientation-determining film 3 can be carried out with ease, and formation of fins on the surface can be prevented.

Therefore, in the course of texturing, texture lines which have sufficient density, depth, width, and uniformity can be formed on the surface of the orientation-determining film 3.

Therefore, the crystalline orientation of the non-magnetic undercoat film 4 which is formed on the film 3 may become uniform, and the crystals in the magnetic film 5 which is formed on the film 4 may be oriented in a particular direction (e.g., in a circumferential direction of a substrate). As a result, magnetic anisotropy of the magnetic film 5 may be enhanced, and the magnetic characteristics of the magnetic recording medium (e.g., S/N ratio, error rate, or thermal fluctuation resistance) may be improved.

When the melting point of X falls within the above range, as described above, the texture processability of the orientation-determining film 3 is enhanced, for the reasons described below. When X having a melting point falling within the above range is contained in the film 3, the film 3 has appropriate hardness, and thus the film can be sufficiently ground during texturing. In addition, the film 3 has viscosity to some extent as compared with a conventionally-used NiP film, and thus formation of fins and deep grinding scars can be prevented.

The aforementioned effect in enhancing S/N ratio can be obtained for the reasons described below. Texture lines which have sufficient density, depth, width, and uniformity can be formed on the surface of the orientation-determining film 3 because of enhancement of texture processability, and thus the crystal grains in the non-magnetic undercoat film 4 which is formed on the film 3 may become fine. As a result, the magnetic grains in the magnetic film 5, which are grown under the effect of the film 4, may become fine and uniform, resulting in reduction in noise.

Meanwhile, when the crystalline orientation of the non-magnetic undercoat film 4 becomes uniform, the crystals in the magnetic film 5 which is formed on the film 4 are oriented in a particular direction (e.g., in a circumferential direction of a substrate); and the magnetic anisotropy of the film 5, as well as reproduction output (S) per unit film thickness, may be enhanced, and thus the film 5 may be thinned. When the film 5 is thinned, the magnetic grains may become further fine, which results in further reduction in noise.

Generally, error rate largely depends on the half power width of a reproduction output peak and S/N ratio. In the magnetic recording medium of the embodiment, when the film 5 is thinned, the half power width of a reproduction output peak is narrowed, and thus the resolution of reproduction output and S/N may be enhanced, resulting in improvement of error rate.

Generally, thermal fluctuation resistance is excellent in a medium which has high coercive force (Hc) and anisotropic magnetism (Hk). In the magnetic recording medium of the embodiment, magnetic anisotropy in a circumferential direction is enhanced, and coercive force (Hc) and anisotropic magnetism (Hk) may be enhanced, which results in high resistance to thermal fluctuation.

As used herein, the term "thermal fluctuation" refers to a phenomenon in which recording bits become unstable and recorded data are thermally lost. In a magnetic recording apparatus, thermal fluctuation is manifested in the form of reduction in reproduction output of recorded data with passage of time. Resistance to thermal fluctuation is represented by the ratio of magnetic energy (vKu) to thermal energy (kT) per activation volume. When the ratio is high, a recording medium is thermally stable.

Grinding which is required to sufficiently even the surface of the orientation-determining film 3 can be carried out with ease, and formation of fins on the surface can be prevented. Thus, the surface of the film 3 can be smoothed and the magnetic recording medium can be made highly even, which results in enhancement of glide-height property.

When the adhesive film 2 is provided, peeling of the orientation-determining film 3 can be prevented. In addition, when the medium has temperature in a topical portion during reproduction of recorded data, the adhesive film can immediately diffuse the heat of the portion in a medium surface direction, thereby suppressing temperature rise and preventing deterioration of magnetic characteristics.

In the magnetic recording medium having the above-described structure, the adhesive film 2 is provided between the non-metallic substrate 1 and the orientation-determining film 3. However, in the present invention, the film 3 may be formed directly on the substrate 1 without formation of the film 2.

When the adhesive film 2 is not provided, the thickness of the orientation-determining film 3 is preferably 100–200 nm. When the thickness of the film 3 is below the above range, the non-metallic substrate 1 may be exposed at texturing, whereas when the thickness is in excess of the above range, the film 3 tends to be peeled off, and unevenness tends to arise on the surface of the film, which is unsatisfactory.

EXAMPLES

Unless otherwise indicated herein, all parts, percents, ratios and the like are by weight.

Test Examples 1 to 42

The present invention will next be described in detail by way of examples, which should not be construed as limiting the invention thereto.

(1) A glass substrate 1, whose surface had been washed, was placed in a DC magnetron sputtering apparatus (Model 3010, product of ANELVA), and the chamber of the apparatus was evacuated to $2 \times 10^{-7}$ Pa. Thereafter, an adhesive film 2 (thickness: 200 nm) as shown in Tables 1 and 2 was formed on the substrate 1, and then an orientation-determining film 3 was formed.

(2) The surface of the thus-formed film 3 was subjected to mechanical texturing in a circumferential direction of the substrate, and then the surface was washed. Table 2 shows the surface roughness (Ra), the maximum protrusion height (Rp), and the density of texture lines of the film 3 after texturing.

(3) A medium substrate 7 which had been subjected to texturing was placed in the aforementioned sputtering apparatus, and the chamber of the apparatus was evacuated to $2 \times 10^{-7}$ Pa. Thereafter, the substrate 7 was heated by use of a heater, and a non-magnetic undercoat film 4 formed of a Cr/Ti alloy (thickness: 250 Å), a magnetic film 5 formed of a Co alloy (thickness: 250 Å), and a carbon protective film 6 were successively formed on the substrate 7, to thereby obtain a magnetic recording medium. The heating temperature of the substrate 7 is shown in Table 1.

The thus-obtained magnetic recording medium was subjected to measurement of coercive force (Hc) and anisotropy (Hc in a circumferential direction/Hc in a radial direction).

In addition, the medium was subjected to measurement of the ratio of recording-reproduction output to noise (S/N ratio) and error rate during reproduction at a line-recording density of 206.8 kFCI, by use of a complex thin-film magnetic recording head having a giant magnetoresistance (GMR) element in a reproduction portion. The results are shown in Table 1.

In order to obtain thermal fluctuation resistance, vKu/kT was calculated from the volume of a magnetic crystal grain (the product of mean grain size and film thickness: v) and an anisotropy constant (Ku) in which Ku is calculated on the basis of the formula Ku=Hk·Ms/2 from saturated magnetization (Ms) and anisotropy magnetic field (Hk), which is obtained from measurement of rotation history loss at room temperature. In this case, k and T represent the Boltzmann constant and absolute temperature, respectively.

Incidentally, vKu/kT represents the ratio of magnetic energy (vKu) to thermal energy (kT), and thus when the value is large, the medium is thermally stable. The results are shown in Table 1.

The orientation-determining film 3 which had undergone texturing was subjected to measurement of surface roughness (Ra), maximum protrusion height (Rp), and density of texture lines. The results are shown in Table 2.

Ra, Rp, and the density of texture lines were measured by use of AFM (product of Digital Instruments).

Test Examples 43 to 52

A magnetic recording medium was produced in the same manner as in Test Examples 1 to 42. The surface roughness (Ra) of the orientation-determining film 3 was measured before and after texturing, and the texture processability of the film 3 was evaluated on the basis of the results of Ra. The results are shown in Table 3.

In each of the magnetic recording media produced in the above-described Test Examples, the mean size of magnetic grains in the magnetic film was measured. The results are shown in Table 4. The magnetic grain size was measured as follows.

A test piece was provided by cutting from the magnetic recording medium, and the cut surface was polished so as to obtain a thickness of 50 μm or less. The image of the thus-prepared test piece was obtained under a transmission electron microscope, and 3000 magnetic grains were randomly chosen to calculate the mean size of the grains.

TABLE 1

| | | Orientation-determining film | | | | | | Magnetic characteristics | | | | Resistance to thermal |
| | | Ni | P | X | | | Heating | | | | | |
| Test Examples | Adhesive film | Content (at %) | Content (at %) | Species | Content (at %) | Texturing | temp. (° C.) | Coercive force | Anisotropy | S/N | Error rate | fluctuation vKu/kT |
|---|---|---|---|---|---|---|---|---|---|---|---|---|
| 1 | Zr | 70 | 20 | Mn | 10 | Yes | 280 | 2510 | 1.45 | 30.2 | 6.84 | 93.2 |
| 2 | Zr | 70 | 20 | Mn | 10 | Yes | 360 | 3230 | 1.39 | 33.5 | 7.54 | 104.7 |
| 3 | Zr | 80 | 15 | Mn | 5 | Yes | 360 | 3100 | 1.37 | 32.9 | 7.46 | 101.3 |
| 4 | Zr | 50 | 40 | Mn | 10 | Yes | 360 | 3130 | 1.30 | 32.7 | 7.38 | 99.5 |
| 5 | Zr | 60 | 15 | Mn | 25 | Yes | 360 | 3190 | 1.32 | 34.5 | 7.73 | 100.8 |
| 6 | — | 70 | 20 | Mn | 10 | Yes | 360 | 2930 | 1.38 | 33.8 | 7.61 | 98.5 |
| 7 | Zr | 70 | 20 | Mn | 10 | No | 360 | 2530 | 1.00 | 35.0 | 7.91 | 89.1 |
| 8 | W | 70 | 20 | Be | 10 | Yes | 340 | 3250 | 1.32 | 33.1 | 7.51 | 106.3 |
| 9 | Mo | 70 | 20 | Mg | 10 | Yes | 340 | 3200 | 1.32 | 33.4 | 7.54 | 104.7 |
| 10 | Nb | 70 | 20 | Ca | 10 | Yes | 340 | 3220 | 1.32 | 33.1 | 7.50 | 107.7 |
| 11 | Cr | 71 | 20 | Sr | 9 | Yes | 340 | 3050 | 1.28 | 31.4 | 6.97 | 94.8 |
| 12 | Zr | 68 | 20 | Ba | 12 | Yes | 340 | 3260 | 1.40 | 32.9 | 7.32 | 106.5 |
| 13 | V | 68 | 20 | Ra | 12 | Yes | 340 | 3250 | 1.40 | 32.9 | 7.32 | 106.4 |
| 14 | Zr | 72 | 20 | Sc | 8 | Yes | 370 | 3120 | 1.33 | 31.2 | 7.18 | 100.3 |
| 15 | Zr | 68 | 25 | Y | 7 | Yes | 390 | 3040 | 1.35 | 31.1 | 7.23 | 98.4 |
| 16 | Zr | 68 | 25 | Mn | 7 | Yes | 370 | 3060 | 1.28 | 30.9 | 6.90 | 96.1 |
| 17 | Cr | 67 | 25 | Fe | 8 | Yes | 370 | 3200 | 1.30 | 31.1 | 7.15 | 104.0 |
| 18 | Cr | 67 | 25 | Co | 8 | Yes | 370 | 3200 | 1.31 | 31.8 | 7.25 | 103.9 |
| 19 | Zr | 70 | 20 | Pd | 10 | Yes | 370 | 3170 | 1.34 | 31.7 | 7.24 | 100.2 |
| 20 | Cr | 70 | 25 | Cu | 5 | Yes | 370 | 3240 | 1.37 | 31.4 | 7.16 | 107.8 |
| 21 | Zr | 70 | 25 | Ag | 5 | Yes | 370 | 3150 | 1.34 | 31.5 | 7.16 | 104.5 |
| 22 | Cr | 66 | 20 | Au | 14 | Yes | 370 | 3130 | 1.33 | 31.5 | 7.18 | 103.9 |
| 23 | Zr | 70 | 20 | Al | 10 | Yes | 370 | 3070 | 1.32 | 32.1 | 7.29 | 114.3 |
| 24 | Zr | 65 | 20 | Si | 15 | Yes | 370 | 3140 | 1.28 | 33.1 | 7.60 | 110.9 |
| 25 | Zr | 70 | 20 | Ge | 10 | Yes | 370 | 3120 | 1.29 | 31.5 | 7.17 | 103.9 |
| 26 | Zr | 70 | 25 | As | 5 | Yes | 370 | 3030 | 1.35 | 31.3 | 7.09 | 101.3 |
| 27 | Zr | 70 | 18 | Sb | 12 | Yes | 370 | 3180 | 1.27 | 30.5 | 6.70 | 96.4 |
| 28 | Zr | 70 | 20 | La | 10 | Yes | 370 | 3230 | 1.30 | 31.2 | 7.12 | 104.3 |
| 29 | Zr | 70 | 20 | Ce | 10 | Yes | 370 | 3210 | 1.31 | 32.4 | 7.29 | 100.5 |
| 30 | Zr | 68 | 20 | Sm | 12 | Yes | 370 | 3250 | 1.29 | 31.9 | 7.19 | 102.8 |
| 31 | Cr | 82 | 15 | Mn | 3 | Yes | 280 | 2400 | 1.20 | 29.1 | 6.59 | 82.1 |
| 32 | Cr | 82 | 15 | Mn | 3 | Yes | 360 | (*1) | | | | |
| 33 | Cr | 50 | 45 | Mn | 5 | Yes | 370 | 2490 | 1.15 | 28.1 | 6.33 | 83.4 |
| 34 | Cr | 45 | 40 | Mn | 15 | Yes | 370 | 2370 | 1.00 | 27.5 | 6.19 | 81.1 |
| 35 | Cr | 90 | 5 | Mn | 5 | Yes | 280 | 1980 | 1.10 | 14.7 | 3.49 | 68.3 |
| 36 | — | 80 | 20 | — | — | Yes | 280 | 2430 | 1.20 | 28.0 | 6.40 | 75.4 |
| 37 | Cr | 80 | 20 | — | — | Yes | 360 | (*2) | | | | |
| 38 | Cr | 80 | 20 | — | — | No | 280 | 1850 | 1.00 | 24.6 | 5.88 | 56.2 |
| 39 | Cr | 70 | 20 | Mo | 10 | Yes | 360 | 1790 | 1.21 | 23.7 | 5.79 | 61.1 |
| 40 | Cr | 70 | 20 | Ta | 10 | Yes | 360 | 1840 | 1.17 | 23.3 | 5.71 | 61.4 |

TABLE 1-continued

| | | Orientation-determining film | | | | Heating | Magnetic characteristics | | | | Resistance to thermal |
|---|---|---|---|---|---|---|---|---|---|---|---|
| | | Ni | P | X | | | | | | | |
| Test Examples | Adhesive film | Content (at %) | Content (at %) | Species | Content (at %) | Texturing | temp. (° C.) | Coercive force | Anisotropy | S/N | Error rate | fluctuation vKu/kT |
| 41 | Zr | 70 | 20 | Tc | 10 | Yes | 360 | 2560 | 1.21 | 27.6 | 6.21 | 75.1 |
| 42 | Zr | 70 | 20 | Sn | 10 | Yes | 280 | (*3) | | | | |

*1, *2, *3: The orientation-determining film was magnetized.
Whether texturing was carried out or not is represented by Yes or No.

TABLE 2

| | | Orientation-determining film | | | | | | | Density of |
|---|---|---|---|---|---|---|---|---|---|
| | | Ni | P | X | | | | | |
| Test Examples | Adhesive film | Content (at %) | Content (at %) | Species | Content (at %) | Texturing | Ra (Å) | Rp (Å) | texture lines (× 1000 lines/mm) |
| 1 | Zr | 70 | 20 | Mn | 10 | Yes | 5.3 | 30.4 | 23 |
| 6 | — | 70 | 20 | Mn | 10 | Yes | 5.4 | 30.9 | 23 |
| 12 | Zr | 68 | 20 | Ba | 12 | Yes | 5.7 | 31.5 | 22 |
| 14 | Zr | 72 | 20 | Sc | 8 | Yes | 6.1 | 32.2 | 22 |
| 15 | Zr | 68 | 25 | Y | 7 | Yes | 6 | 32.4 | 21 |
| 17 | Cr | 67 | 25 | Fe | 8 | Yes | 5.6 | 30.6 | 22 |
| 18 | Cr | 67 | 25 | Co | 8 | Yes | 5.5 | 30.2 | 22 |
| 19 | Zr | 70 | 20 | Pd | 10 | Yes | 5.5 | 30.9 | 22 |
| 20 | Cr | 70 | 25 | Cu | 5 | Yes | 6.4 | 32.9 | 22 |
| 21 | Zr | 70 | 25 | Ag | 5 | Yes | 6.3 | 33.1 | 22 |
| 22 | Cr | 66 | 20 | Au | 14 | Yes | 6.1 | 32.4 | 22 |
| 23 | Zr | 70 | 20 | Al | 10 | Yes | 5.8 | 31.4 | 24 |
| 24 | Zr | 65 | 20 | Si | 15 | Yes | 5.9 | 31.1 | 23 |
| 25 | Zr | 70 | 20 | Ge | 10 | Yes | 5.8 | 30.9 | 22 |
| 26 | Zr | 70 | 25 | As | 5 | Yes | 5.9 | 31 | 21 |
| 27 | Zr | 70 | 18 | Sb | 12 | Yes | 5.4 | 28.6 | 21 |
| 28 | Zr | 70 | 20 | La | 10 | Yes | 5.6 | 30.1 | 22 |
| 29 | Zr | 70 | 20 | Ce | 10 | Yes | 5.4 | 29.4 | 22 |
| 30 | Zr | 68 | 20 | Sm | 12 | Yes | 5.7 | 31.9 | 22 |
| 33 | Cr | 50 | 45 | Mn | 5 | Yes | 3.1 | 16.4 | 15 |
| 36 | — | 80 | 20 | — | — | Yes | 8.9 | 68.3 | 17 |
| 38 | Cr | 80 | 20 | — | — | No | 15.6 | 146.4 | — |
| 39 | Cr | 70 | 20 | Mo | 10 | Yes | 8.3 | 60.5 | 18 |
| 40 | Cr | 70 | 20 | Ta | 10 | Yes | 8.4 | 59.6 | 18 |
| 41 | Zr | 70 | 20 | Tc | 10 | Yes | 8.3 | 56.9 | 19 |
| 42 | Zr | 70 | 20 | Sn | 10 | Yes | 9.9 | 109.3 | 19 |

TABLE 3

| | | | | Orientation-determining film | | | | | | | |
|---|---|---|---|---|---|---|---|---|---|---|---|
| | | | | Composition | | | | | Ra | | Ra |
| | | Adhesive film | | Ni | P | X | | | (Before | Texturing | (After) |
| Test Examples | Substrate | Species | Thickness | Content (at %) | Content (at %) | Species | Content (at %) | Thickness (nm) | texturing) (nm) | process-ability | texturing) (nm) |
| 1 | Glass substrate | Zr | 20 | 70 | 20 | Mn | 10 | 150 | 1.29 | AAA | 0.53 |
| 43 | Glass substrate | Zr | 20 | 70 | 20 | Mn | 10 | 20 | 0.83 | AAA | 0.49 |
| 44 | Glass substrate | Zr | 20 | 70 | 20 | Mn | 10 | 290 | 1.41 | — | 0.57 |
| 45 | Glass substrate | — | — | 70 | 20 | Mn | 10 | 150 | 1.47 | — | 0.55 |
| 46 | Tempered glass | Zr | 20 | 70 | 20 | Mn | 10 | 150 | 1.32 | AAA | 0.54 |
| 47 | Ceramics | Zr | 20 | 70 | 20 | Mn | 10 | 150 | 1.45 | AAA | 0.56 |
| 48 | Glass substrate | Zr | 20 | 70 | 20 | Mn | 10 | 410 | 1.79 | BBB | 0.69 |

TABLE 3-continued

| | | Orientation-determining film | | | | | | | | |
|---|---|---|---|---|---|---|---|---|---|---|
| | | | Composition | | | | | Ra | | Ra |
| | | | Ni | P | X | | | (Before | Texturing | (After) |
| Test | | Adhesive film | Content | Content | | Content | Thickness | texturing) | process- | texturing) |
| Examples | Substrate | Species | Thickness | (at %) | (at %) | Species | (at %) | (nm) | (nm) | ability | (nm) |
| 49 | Glass substrate | Zr | 20 | 70 | 20 | Mn | 10 | 10 | 1.04 | BBB | Adhesive film exposed |
| 50 | Glass substrate | — | — | 70 | 20 | Mn | 10 | 50 | 1.28 | BBB | Substrate exposed |
| 51 | Glass substrate | — | — | 70 | 20 | Mn | 10 | 250 | 1.84 | BBB | (*1) |
| 52 | Glass substrate | Zr | 260 | 70 | 20 | Mn | 10 | 150 | 1.78 | BBB | 0.71 |

*1: The orientation-determining film was peeled off in a fringe portion

The following substrates were employed.

Glass substrate: glass-ceramic substrate M4 material (product of NGK Insulators Ltd.) (diameter: 84 mm, thickness: 0.625 mm, surface roughness: 0.8 nm).

Tempered glass: tempered glass substrate (product of Nippon Sheet Glass Co., Ltd)(diameter: 65 mm, thickness: 0.625 mm, surface roughness: 0.9 nm).

Ceramic: aluminum oxide sintered substrate (product of Showa Denko K.K.)(aluminum purity: 99.99%, diameter: 84 mm, thickness: 0.635 mm, surface roughness: 12 nm).

Texturing processability was evaluated as follows. When surface roughness (Ra) is 0.6 nm or less after texturing, rating "AAA" is assigned. When Ra is in excess of 0.6 nm after texturing or when the undercoat film (substrate) is exposed or peeled off, rating "BBB" is assigned.

TABLE 4

| | | Orientation-determining film | | | | | Diameter of |
|---|---|---|---|---|---|---|---|
| Test | Ad- | Ni | P | X | | | magnetic |
| Exam- | hesive | content | content | Spe- | Content | Tex- | particles |
| ples | film | (at %) | (at %) | cies | (at %) | turing | (Å) |
| 2 | Zr | 70 | 20 | Mn | 10 | Yes | 124 |
| 15 | Zr | 68 | 25 | Y | 7 | Yes | 135 |
| 23 | Zr | 70 | 20 | Al | 10 | Yes | 118 |
| 24 | Zr | 65 | 20 | Si | 15 | Yes | 119 |
| 33 | Cr | 50 | 45 | Mn | 5 | Yes | 162 |
| 36 | — | 80 | 20 | — | — | Yes | 158 |
| 38 | Cr | 80 | 20 | — | — | No | 171 |
| 41 | Zr | 70 | 20 | Tc | 10 | Yes | 151 |

As is apparent from the comparison of Test examples 1, 2, and 36 in Table 1, characteristics, such as coercive force, S/N ratio, error rate, and thermal fluctuation resistance, of the magnetic recording medium comprising the orientation-determining film 3 formed of NiP10Mn in which Mn (10 atomic %) is added to NiP were enhanced compared with the medium comprising an NiP film. In addition, when the heating temperature of the medium substrate 7 is high, the magnetic recording medium has excellent magnetic characteristics.

As is apparent from the comparison of Test Examples 1 and 42, when Sn having a melting point of less than 600° C. is employed as X, the magnetization temperature of the orientation-determining film 3 is lowered.

As is apparent from the comparison of Test Examples 3 and 32, when the amount of X in the orientation-determining film 3 is 5 atomic % or more, the magnetization temperature of the film 3 can be increased.

As is apparent from the comparison of Test Examples 4, 33, and 34, when the amount of P in the orientation-determining film 3 is in excess of 40 atomic %, or when the sum of the amounts of P and X is in excess of 50 atomic %, magnetic anisotropy is lowered.

As is apparent from the comparison of Test Examples 1, 6, and 36 in Table 2, Ra and Rp on the surface of the film 3 of the magnetic recording medium comprising the orientation-determining film 3 formed of NiP10Mn can be reduced compared with the medium comprising an NiP film. Therefore, when the film 3 which is formed of NiPX is employed, texture processability of the film 3 can be enhanced, thereby preventing formation of fins.

As is apparent from Test Example 33, when the amount of P in the orientation-determining film 3 is in excess of 40 atomic %, Ra and Rp become very low compared with Test Example 1, and thus texture processability deteriorates.

As is apparent from Test Examples 40 and 41, when Ta (2996) and Tc (2140), which have melting points in excess of 2000° C., are employed as X, texture processability deteriorates.

As is apparent from Table 3, when the thickness of the orientation-determining film 3 is 20–300 nm, texture processability can be enhanced.

In addition, when the non-magnetic adhesive film 2 is provided, peeling of the orientation-determining film 3 can be prevented.

As is apparent from Table 4, in the magnetic recording medium comprising the orientation-determining film 3 which is formed of NiPX, magnetic grains may become fine compared with the medium comprising an NiP film.

As described hereinabove, the magnetic recording medium of the present invention is characterized in that an orientation-determining film, which determines crystalline orientation of a film provided directly on the orientation-determining film when subjected to surface-texturing, is formed between a non-metallic substrate and a non-magnetic undercoat film. The orientation-determining film comprises NiPX and X has a melting point of 600–2000° C. Therefore, the processability in texturing the orientation-determining film is enhanced.

Due to high processability, the orientation-determining film can be easily ground in order to obtain a sufficiently smooth surface of the orientation-determining film, and formation of fins can be prevented.

Thus, in the course of texturing, texture lines having sufficient line density, depth, width, and uniformity can be formed in the orientation-determining film.

According to the present invention, the crystalline orientation of a magnetic film formed on the orientation-determining film via the non-magnetic undercoat film is enhanced, thereby improving magnetic anisotropy, and the S/N ratio, error rate, and resistance to thermal fluctuation of a magnetic recording medium can be enhanced.

While the invention has been described in detail and with reference to specific embodiments thereof, it will be apparent to one skilled in the art that various changes and modifications can be made therein without departing from the spirit and scope thereof.

What is claimed is:

1. A magnetic recording medium comprising (a) a non-metallic substrate, (b) a non-magnetic undercoat film, (c) a magnetic film, (d) a protective film, and (e) an orientation-determining film, which determines crystalline orientation of a film provided directly on the orientation-determining film when subjected to surface-texturing, between the non-metallic substrate and the non-magnetic undercoat film;

wherein the orientation-determining film comprises NiPX; wherein X is one or more species selected from the group consisting of Group IIA, IIIA, VIIA, VIII, IB, IIIB, IVB, and VB, other than Ac (actinide)-series elements and X has a melting point of 600–2000° C.

2. A magnetic recording medium according to claim 1, wherein the orientation-determining film comprises a material containing P and X in a total amount of 20–50 atomic %.

3. A magnetic recording medium according to claim 1, wherein the P content is 15–40 atomic %.

4. A magnetic recording medium according to claim 1, wherein the X content is 2–25 atomic %.

5. A magnetic recording medium according to claim 1, further comprising (f) a non-magnetic adhesive film which prevents defoliation of the orientation-determining film from the substrate between the non-metallic substrate (a) and the orientation-determining film (e), wherein the non-magnetic adhesive film (f) comprises one or more elements selected from the group consisting of Cr, Mo, Nb, V, Re, Zr, W, and Ti.

6. A magnetic recording medium according to claim 1, wherein X is one or more species selected from the group consisting of Be, Mg, Ca, Sr, Ba, Ra, Sc, Y, La, Ce, Pr, Nd, Sm, Tb, Ho, Mn, Fe, Pd, Co, Rh, Cu, Ag, Au, Al, Si, Ge, As, and Sb.

7. A magnetic recording medium according to claim 1, wherein X is one or more species selected from Groups IIA, IIIA, VIIA, VIII, IB and IIIB.

* * * * *